United States Patent [19]
McClure

[11] Patent Number: 5,404,331
[45] Date of Patent: Apr. 4, 1995

[54] REDUNDANCY ELEMENT CHECK IN IC MEMORY WITHOUT PROGRAMMING SUBSTITUTION OF REDUNDANT ELEMENTS

[75] Inventor: David C. McClure, Carrollton, Tex.

[73] Assignee: SGS-Thomson Microelectronics, Inc., Carrollton, Tex.

[21] Appl. No.: 99,606

[22] Filed: Jul. 30, 1993

[51] Int. Cl.$^6$ .............................................. G11C 7/00
[52] U.S. Cl. .................... 365/200; 365/201; 365/230.03; 371/10.2
[58] Field of Search ............... 365/200, 201, 230.03, 365/189.08, 96; 371/10.2

[56] References Cited

U.S. PATENT DOCUMENTS

| | | | |
|---|---|---|---|
| 4,422,161 | 12/1983 | Kressel et al. | 365/200 |
| 4,860,260 | 8/1989 | Saito et al. | 365/201 |
| 4,922,134 | 5/1990 | Hoffmann et al. | 365/201 |
| 5,058,069 | 10/1991 | Gaultier et al. | 365/200 |
| 5,084,838 | 1/1992 | Kajimoto et al. | 365/200 |
| 5,113,371 | 5/1992 | Hamada | 365/201 |
| 5,128,944 | 7/1992 | Flaherty et al. | 365/200 |
| 5,195,057 | 3/1993 | Kasa et al. | 365/200 |
| 5,243,570 | 9/1993 | Saruwatari | 365/201 |
| 5,255,226 | 10/1993 | Ohno et al. | 365/200 |

Primary Examiner—Eugene R. LaRoche
Assistant Examiner—Tan Nguyen
Attorney, Agent, or Firm—Kenneth C. Hill; Lisa K. Jorgenson; Richard K. Robinson

[57] ABSTRACT

Disclosed is an integrated circuit memory having a plurality of addressable elements and a plurality of redundant elements for substitution of the addressable elements. A configurable selection circuit for each redundant element allows for associating the redundant element with an address for access of the redundant element in place of an addressable element, upon permanent physical modification of the integrated circuit memory. Redundant element testing is provided by use of bypass circuitry, responsive to a redundant element test signal. The bypass circuitry includes circuitry associated with each redundant element, for simulating access of the redundant element without modification of the configurable selection circuit for the redundant element. Each redundant element has an address, unique among the redundant elements but duplicating an address for a regular element, which is used for accessing the redundant element during testing.

19 Claims, 8 Drawing Sheets

REDUNDANCY ELEMENT CHECK IN IC MEMORY WITHOUT PROGRAMMING SUBSTITUTION OF REDUNDANT ELEMENTS

FIELD OF THE INVENTION

The invention is in the field of integrated circuits containing memory arrays, and is more particularly directed to providing for evaluation of redundant elements in such circuits without programming the circuit to substitute those elements for regular elements.

BACKGROUND OF THE INVENTION

A manufacturer of integrated circuits may often reduce overall manufacturing costs of its product by reducing the rejection rate for defective individual parts. One way to reduce the rejection rate is through ever finer refinement of manufacturing processes. Such refinement, though, is subject to the laws of diminishing returns. For example, a given integrated circuit may contain several thousand individual electronic components, such as transistors, diodes and the like. It may prove relatively easy and inexpensive to reduce the probability of a particular integrated circuit having one or more defective components to a certain percentage but increasingly difficult or expensive to improve the rejection rate beyond that point. Still, the presence of only one or two defective components out of thousands of components on an integrated circuit will dictate the rejection of that integrated circuit and potentially thousands of other integrated circuits.

Another solution to reducing the rejection rate, without expensive refinements of manufacturing processes, is to provide auxiliary, sometimes called redundant, circuit components on the integrated circuit. This solution is practical where testing can locate, within certain bounds, the defective component, and the circuit is readily reconfigurable to allow substitution of an auxiliary component for the defective component. Integrated circuit matrix memory arrays, including static random access memories (SRAM), are examples of such integrated circuits. In addition, many complex microprocessors now include significant amounts of on-chip memory, such as 64 kbytes or more of read-only memory and 64 kbytes or more of random access memory.

Memory arrays are characterized by the regular repetition of components. A very substantial portion of an integrated memory array is taken up by substantially identical memory cells disposed in regular rows and columns.

Decoding circuits are provided on the integrated circuit memory for operating on various combinations of electrical signals provided as inputs to the integrated circuit to generate signals within the integrated circuit for causing activation of a specific group of cells in the array. The decoder circuit generally includes a plurality of row decoders, each 0f which is adapted to provide a row select signal in response to a particular known set of electrical signals. Column decoders function similarly. A memory location is defined for each intersection of a row and a column.

The foregoing combinations of electrical signals typically comprise sets of logical signals. A logic signal is an electrical signal which represents two states, termed 0 and 1. Each logic signal represents a selected one of these states by being set at a certain predetermined voltage level, for example $V_{cc}$ for 1. Another voltage level may then be taken as 0 which is ground. Each logic signal represents one bit of information. While combinations of logic signals may be provided to integrated circuits in various ways, one common way, seen in digital computers, is to provide a separate conductive path for each logical signal. Different combinations, by virtue of activating different rows and columns of memory cells through the decoder, represent what are called memory addresses. The intersection of a particular row of cells or column of cells actuated is a memory element. Each row element is defined by the same number of logic signals. Similarly each column element is defined by the same number of logic signals.

A computer will address a memory address location in a time segment known as a memory cycle. Accordingly, one set of conductive paths, known as address lines, provides for transmission of all memory addresses. The set of address lines is referred to as the address bus. One memory address appears on the address bus in each memory cycle. Thus preserving timing of propagation of address signals is valuable.

The repetitive nature and "addressable" characteristics of integrated circuit array memories are the aspects of these integrated circuits which are exploited to substitute auxiliary elements. Because one row or column of memory cells is substantially like another row or column of memory cells, it does not matter which row or column stores any particular information. What matters is that it does store it and that the information can be located thereafter.

Substitution of auxiliary elements for regular elements requires reconfiguration of the circuit so that a memory address causes activation of a previously unused element of memory cells. It may also be necessary to cease activation of the defective regular element.

The electrically conductive paths supplying power to each row and column decoder, and the electrically conductive paths corresponding to the actuation lines, can be caused to lie on the surface of the integrated circuit and thus be accessible for reconfiguration.

Reconfiguration is achieved by incorporating an element, such as a fusible link, in a surface conductive path on the integrated circuit. Such fusible links, or configuration links, may be opened by a variety of steps, e.g., exposure to laser light to vaporize the link. Opening a link breaks the electrical connection between, for example, one element and the balance of the circuit. Opening a configuration link is used to remove a portion of a circuit element, or a substantial collection of elements, from the overall circuit.

In the prior art, reconfiguration has been done after evaluation of the addressable rows and columns in the memory, but without testing of the redundant elements. Obviously, the flaws which can occur in the regular portion of the memory array can also occur in the redundant elements. Once a memory circuit is reconfigured, or programmed, to substitute in a redundant location no further reconfiguration is possible to remove the redundant element should it prove defective.

SUMMARY OF THE INVENTION

It is an object of the invention to provide an integrated circuit memory.

It is another object of the invention to provide for evaluation of memory redundant elements without reconfiguration or permanent programming of the memory.

The invention provides an integrated circuit memory having a plurality of addressable elements and a plurality of redundant elements for substitution of the addressable elements. A configurable selection circuit for each redundant element allows for associating the redundant element with an address for access of the redundant element in place of an addressable element, upon permanent physical modification of the configurable selection circuit. Redundant element testing is provided by use of bypass circuitry, responsive to a redundant element test signal. The bypass circuitry includes circuitry associated with each redundant element for simulating access of the redundant element without modification of the configurable selection circuit for the redundant element. Each redundant element has an address, unique among the redundant elements but which may duplicate an address for a regular element, which is used for accessing the redundant element during testing.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
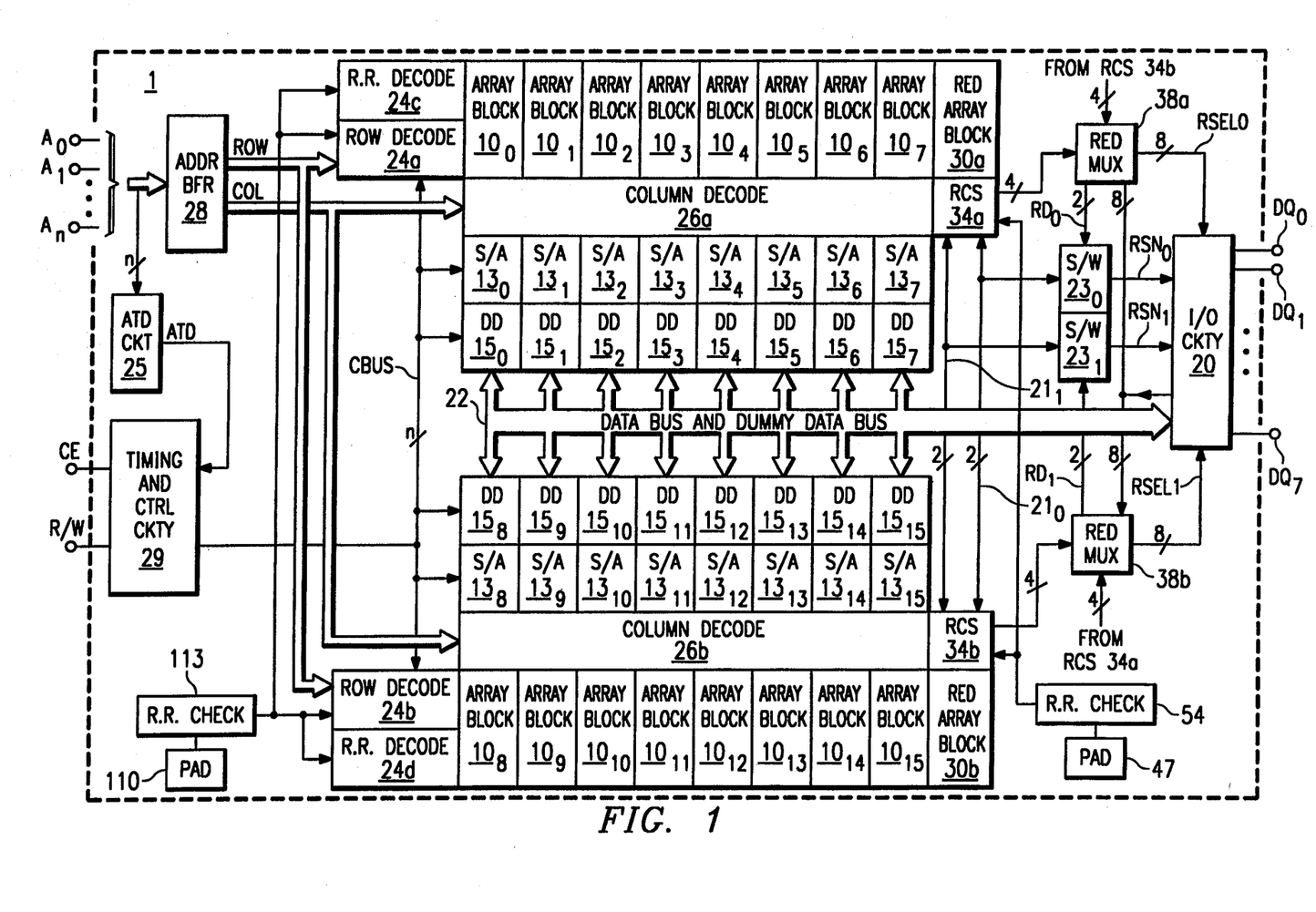
FIG. 1 is a block diagram of an integrated circuit memory.

FIG. 1 illustrates an example of an integrated circuit (IC) memory 1 into which a preferred embodiment of the invention may be implemented. Integrated circuit, memory 1 is a static random access memory (SRAM) of otherwise conventional architecture, having its memory cells in multiple blocks 10 which are shown in their physical location in IC memory 1. It is contemplated that integrated circuits of other types having memory arrays including redundant columns and rows may also benefit from the present invention, including read-only memories, FIFOs, DRAMs and the like, as well as microprocessors and other logic devices having embedded memories.

Memory cells in IC memory 1 are arranged in rows and columns. IC memory 1 is an SRAM, and includes 512 columns for each of 2048 rows; of course, the present invention is applicable to other row-by-column organizations. It should be noted that the designation of rows and columns in memory 1, and particularly the redundant column architecture to be described hereinbelow, uses the term row to refer to the array direction in which a plurality of memory cells are selected by way of a word line; in conventional memories, each of the memory cells in the selected row are generally coupled to one or a complementary pair of bit lines. The term column is used in this description to refer to the array direction in which one or more of the memory cells in the selected row are selected for read or write access; in conventional memories, this is generally accomplished by coupling one of the bit lines to a sense amplifier/write circuit, or to an internal data bus. It is contemplated that such use of the terms and columns is consistent with the general understanding in the art.

Address terminals $A_0$ through $A_n$ receive an address signal according to which the memory cells to be accessed are designated. In the conventional manner, address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line in the conventional manner, and in this example are located along a side of the memory array blocks 10. Column decoders 26a, 26b, in this example, select eight memory cells in the selected row to be sensed by a sense amplifier 13 according to the column portion of the address.

In memory 1 the memory cells are grouped into sixteen primary array blocks $10_0$ through $10_{15}$. The number of array blocks 10 may, of course, vary from implementation to implementation. This partitioning of the memory into sixteen primary array blocks 10 is particularly beneficial in low power memories, such as may be used in portable computers, as only the block 10 in which the selected memory cells are located need be enabled during a cycle. In this example, each primary array block 10 includes 64 columns. Selection of the block may be done according to one of the row address bits (indicating upper or lower half) and to four of the column address bits (indicating one of sixteen primary array blocks 10 to be selected).

Alternatively, selection of a row within one of said primary array blocks 10 may be made by way of a global word line generated by row decoders 24a, 24b, extending across those primary array blocks 10 for which it is operable. Pass gates by which memory cells within each of primary array blocks 10 are connected to their bit lines are, in this alternative arrangement, controlled by local word lines which extend only within each primary array block 10 for each row portion therein. In this arrangement, pass transistors connected between each global word line and the local word lines are enabled according to a block portion of the column address, so that only the local word line associated with the primary array block 10 selected by the column address is enabled, thus reducing the active power dissipation of each memory cycle. An example of such an arrangement is described in Sakurai, et al., "A Low Power 46 ns 256 kbit CMOS Statis RAM with Dynamic Double Word Line", *IEEE J Solid state Circuits*, Vol. SC-19, No. 5 (IEEE, October 1984), pp. 578–585.

Memory 1, as in the case of most modern SRAMs and DRAMs, includes some amount of dynamic operation, such as precharging and equilibration of certain nodes (e.g., bit lines) at particular points in the memory cycle. Initiation of the cycle in SRAM 1 occurs by way of address transition detection, performed by address transition detection (ATD) circuit 25. ATD circuit 25 is connected to each of the address inputs $A_0$ through $A_n$, preferably prior to address buffers 28 (as shown), and generates a pulse on line ATD responsive to detecting a transition at any one or more of address inputs $A_0$ through $A_n$, such a pulse useful in controlling the internal operation of memory 1 in the conventional manner.

Other internal operational functions are controlled by timing and control circuitry 29, which receives the signal on line ATD from ATD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense amplifiers 13 and data drivers 15; other functions are similarly controlled by timing and control circuitry 29 in the conventional manner, with their connections not shown in FIG. 1 for purposes of clarity.

Memory 1 in this example is of the byte-wide type, and as such it has eight input/output terminals $DQ_0$ through $DQ_7$ at which output data is presented during a read operation, and at which input data is received during a write operation. Input/output circuitry 20 is connected between data bus 22 and terminals DQ, and includes conventional input and output buffers connected thereto.

Each of primary array blocks $10_0$ through $10_{15}$ is associated with a corresponding group of sense amplifiers $13_0$ through $13_{15}$, as shown in FIG. 1. In this example, eight individual sense amplifiers 13 are included within each group of sense amplifiers $13_0$ through $13_{15}$, one sense amplifier 13 for each of the eight bits to be communicated on internal data bus 22 from the selected one of primary array blocks $10_0$ through $10_{15}$. Groups of data drivers $15_0$ through $15_{15}$ are each associated with a corresponding group of sense amplifiers $13_0$ through $13_{15}$ for receiving the data signal therefrom and for driving internal data bus 22 therewith; individual data drivers 15 are associated with individual sense amplifiers 13 in each group, one data driver 15 for driving each line in data bus 22.

The memory array is also divided into halves, with primary array blocks $10_0$ through $10_7$ in one array half and primary array blocks $10_8$ through $10_{15}$ in the other half. Internal data bus 22 runs the length of the array halves, and is located therebetween as shown in FIGS. 1. In this example, data bus 22 includes eight data conductors, each associated with an input/output terminal $DQ_0$ through $DQ_7$ and coupled thereto via input/output circuitry 20. Each individual data conductor is connected to a corresponding data driver 15 in each of the sixteen data driver groups $15_0$ through $15_{15}$ of the sixteen primary array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

In this example, data bus 22 also preferably includes eight dummy data conductors, each of which are also connected to a corresponding data driver 15 in each of the sixteen data driver groups $15_0$ through $15_{15}$ of the sixteen primary array blocks $10_0$ through $10_{15}$, for purposes of precharging data bus 22 by way of charge sharing. Each of these dummy data conductors preferably physically resembles one of the true data conductors, preferably having substantially the same length and cross-sectional area and being formed of the same material, and is maintained, at all times, at a complementary state relative to its true data conductor.

Figure 2:
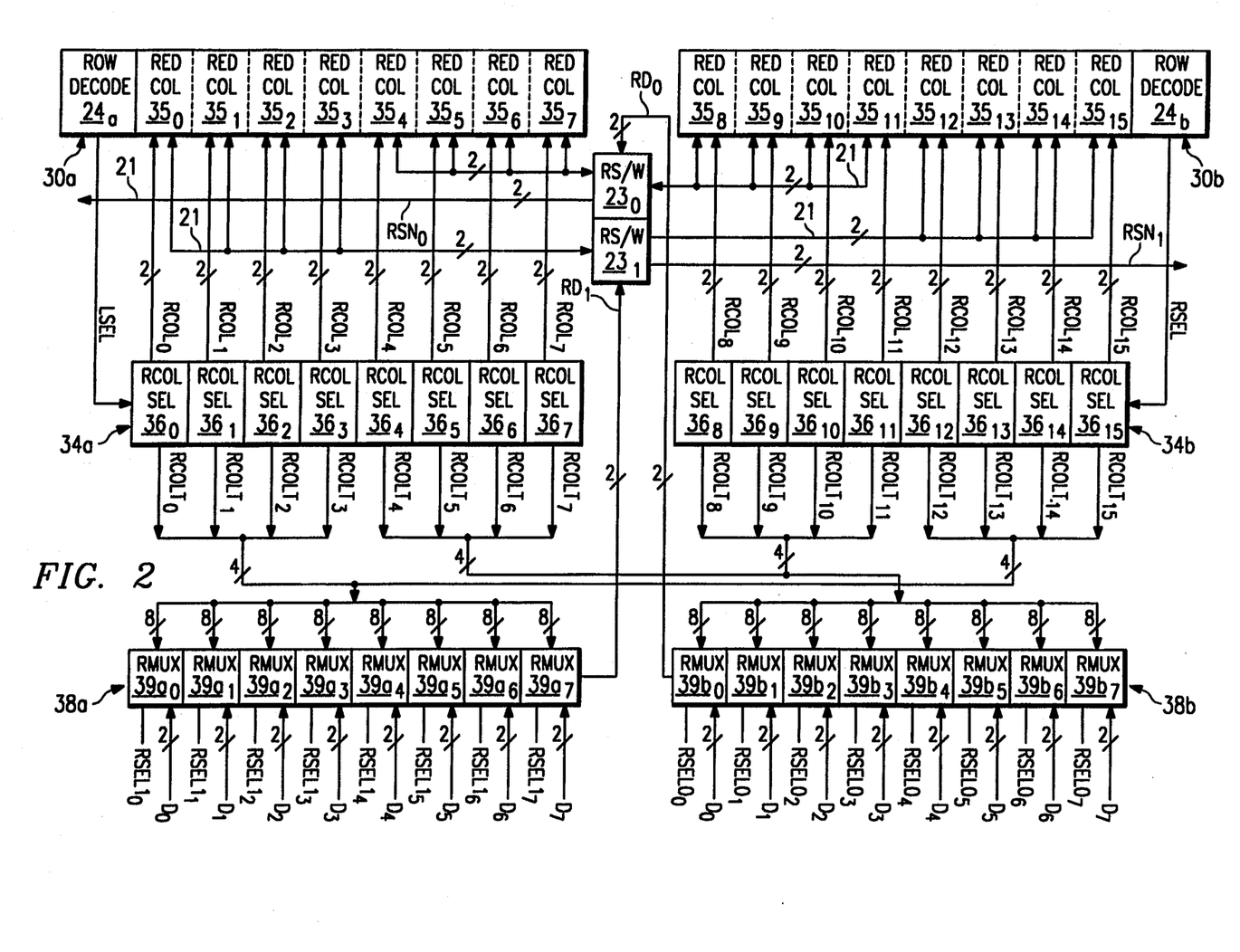
FIG. 2 is a block diagram of a redundant column architecture for the memory of FIG. 1.

Referring to FIGS. 1 and 2 in combination, memory 1 also includes a pair of redundant array blocks 30a, 30b, each associated with one of the half-arrays of primary array blocks 10. FIG. 2 illustrates the redundancy architecture of memory 1 in block functional form, without relation to the layout suggested in FIG. 1. In this embodiment, redundant array block 30a has eight redundant columns $35_0$ through $35_7$ therein, each containing memory cells selectable according to a row line issued from row decoder 24a or redundant row decoder 24c corresponding to the same row addresses by which memory cells are selected in primary array blocks $10_0$ through $10_7$. Similarly, redundant array block 30b has eight redundant columns $35_8$ through $35_{15}$ therein, each containing memory cells selectable according to a row line issued from row decoder 24b or redundant row decoder 24d according to the same row addresses by which memory cells are selected in primary array blocks $10_8$ through $10_{15}$. As will be described in further detail hereinbelow, each of the eight redundant columns 25 in each of the redundant array blocks 30a, 30b may replace a column in any one of the primary array blocks 10 in its array half (e.g., selectable by a row line from the same row decoder 24a, 24b, respectively), and may be associated with any one of the input/output terminals DQ.

Associated with redundant array blocks 30a, 30b are redundant column select blocks 34a, 34b, respectively. Each of redundant column select blocks 34a, 34b contain a redundant column decoder 36 for each of the redundant columns 35 in its associated redundant array block 30a, 30b, respectively. Each redundant column decoder 35 includes fuses by which the column address to which its associated redundant column 25 corresponds can be selected, receives the column address on bus COL, and issues a select signal on a line RCOL to its associated redundant column 35. Redundant column decoders 34a, 34b also each receive a row select line LSEL, RSEL, respectively, from row decoders 24a, 24b, or redundant row decoders 24c, 24d respectively; lines LSEL, RSEL each indicate if the selected row is within the half array associated with row decoders 24a, 24b, or redundant row decoders 24c, 24d respectively, and accordingly corresponds to the state of the most significant row address bit. Each redundant column 36 is operable to issue the select signal on its output line RCOL, when redundancy is enabled, if the column address on bus COL matches the address indicated by the state of its fuses and if the select signal on its associated row select line LSEL, RSEL indicates that a row in its half array is selected. The operation of redundant column decoders 36 will be described in further detail hereinbelow.

Redundant column select blocks 34a and 34b as well as redundant row decoders 24c and 24d may be activated by application of selected addresses to address buffer 28 and check signals applied to pads 47 and 110, respectively. Pad 47 is connected to a redundant column check signal generate 54 which in turn is connected to blocks 34a and 34b. Pad 110 is connected to redundant row check signal generator 113, which in turn is connected to row decode blocks 24a, 24b and redundant row decode blocks 24c, 24d. Pads 47 and 110 are not accessible after packaging of IC1.

Two redundant sense/write circuits $23_0$, $23_1$ are provided in this embodiment of the invention, each capable of sensing the stored data state in a selected memory cell in a redundant column 35, and for writing data thereto, depending upon whether a read operation or a write operation is being effected. Redundant sense/write circuits $23_0$, $23_1$ are each associated with four redundant columns 35 in each redundant array block 30a, 30b, and connected thereto by way of a complementary redundant data bus 21. For example, redundant sense/write circuit $23_0$ is associated with redundant columns $35_4$ through $35_7$ of redundant array block 30a and with redundant columns $35_8$ through $35_{11}$ of redundant array block 30b, and redundant sense/write circuit $23_1$ is associated with redundant columns $35_0$ through $35_3$ of redundant array block 30a and with redundant columns $35_{12}$ through $35_{15}$ of redundant array block 30b. Each redundant sense/write circuit 23 presents sensed (i.e., read) data to input/output circuitry 20 via a single pair of complementary data lines. RSN, and receives input (i.e., write) data on a single pair of complementary lines $RD_0$, $RD_1$, respectively, from redundant multiplexor blocks 38a, 38b, respectively.

Conventional sense amplifier may be used to provide redundant read/write sense circuits 23. The control signal RSCLK, is controlled so that both redundant sense/write circuits 23 are enabled to sense the beginning of each cycle, regardless of address value. If the address received by memory 1 does not correspond to any of the columns to be replaced by one of redundant columns 35 associated therewith, control signals ISO, RSAEQ_, and $RSCLK_1$ are then preferably controlled to disable the redundant sense/write circuits 23. In this way, because the enabling of a redundant sense/write circuit 23 does not depend on the address, the access time for memory cells 40 in redundant columns 35 is not slowed relative to an access to a memory cell in a primary array block 10 by the additional decoding of redundant column decoders 36. When disabled (by lines ISO maintained high, and lines RSAEQ_ and $RSCLK_1$ maintained low), sense nodes RSNT and RSNC in sense/write circuits 23 remain equilibrated and precharged to $V_{cc}$.

Redundant multiplexor blocks 38a, 38b each include eight redundant multiplexors 39, one associated with each input/output terminal DQ; redundant multiplexor block 38a is associated with redundant sense/write circuit $23_1$, and redundant multiplexor block 38b is associated with redundant sense/write circuit $23_0$. Each redundant multiplexor 39 receives all eight redundant column select signals RCOL generated by those redundant column decoders 36 associated with its associated redundant sense/write circuit 23. In this example, redundant multiplexor block 38a receives redundant column select signals $RCOL_0$ through $RCOL_3$ and $RCOL_{12}$ through $RCOL_{15}$, while redundant multiplexor block 38b receives redundant column select signals $RCOL_4$ through $RCOL_{11}$. Each of the redundant multiplexors 39 include fuses for determining which one (or more) of its received redundant column select signals RCOL corresponds to its associated input/output terminal DQ, and couples the output of its associated redundant sense/write circuit 23 to the driver for its associated input/output terminal DQ by way of a signal on its output line RSEL; in addition, each redundant multiplexor 39 also couples differential input data lines DT, DC to its associated redundant sense/write circuit 23 according to the fuses opened therein.

By way of example, redundant multiplexor $39a_0$ is associated with redundant sense/write circuit $23_1$ and with input/output terminal $DQ_0$. Redundant multiplexor receives redundant column select signals $RCOL_0$ through $RCOL_3$ from redundant column selection circuits $36_0$ through $36_3$ in redundant column select block 34a, and redundant column select signals $RCOL_{12}$ through $RCOL_{15}$ from redundant column $36_{12}$ through $36_{15}$ in redundant column select block 34b. Fuses within redundant multiplexor $39a_0$ will, as will be described in further detail below, select the one (or more) of redundant column select signals $RCOL_0$ through $RCOL_3$ and $RCOL_{12}$ through $RCOL_{15}$ for which it will issue an active signal on line $RSEL1_0$ upon receipt of one of redundant column select signals $RCOL_n$ which matches the fuse pattern in redundant multiplexor $39a_0$. This will cause input/output circuit 20 to couple input/output terminal $DQ_0$ to redundant sense/write circuit $23_1$, and thus to the matching redundant column $35_n$ selected by the appropriate redundant column decoder $36_n$, rather than to data bus 22 and thus to the selected memory cells in primary array blocks 10.

Redundant multiplexors 39 also couple the input data from the appropriate input/output terminal DQ to sense/write circuits $23_0$, $23_1$ on complementary lines $RD_0$, $RD_1$, respectively, responsive to the state of the fuses therein and to the redundant column select signals on lines RCOL.

Figure 3:
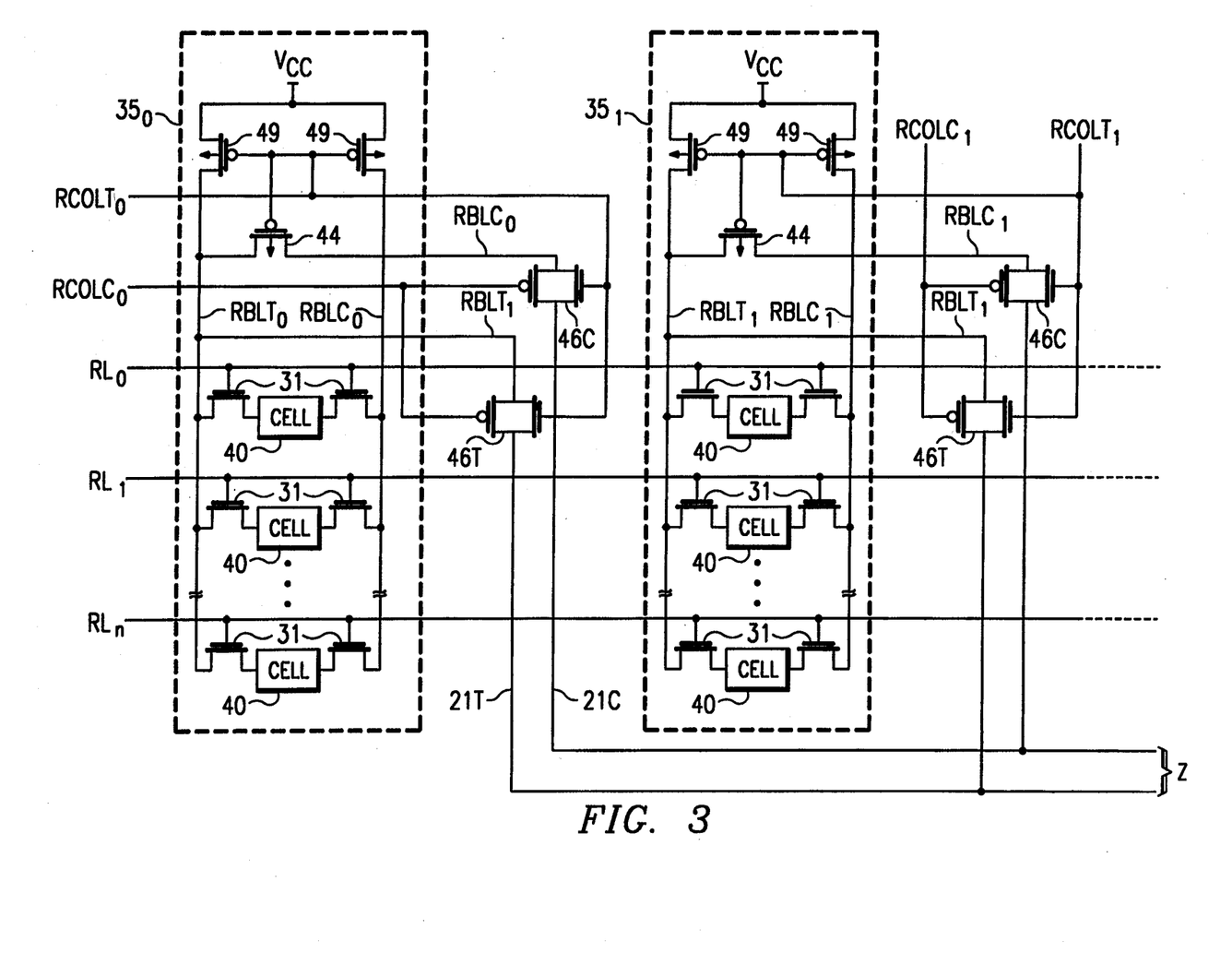
FIG. 3 is an electrical schematic of a sense/write circuit for the redundant column architecture of FIG. 2.

FIG. 3 illustrates an example of the construction and operation of redundant columns 35. As shown in FIG. 3, redundant columns $35_0$, $35_1$ are constructed in the conventional manner for an SRAM; columns in primary array blocks 10 (and, of course, the others of redundant columns 35) are similarly constructed. Redundant column $35_0$ includes, in this example, 256 memory cells 40, each connectable to differential bit lines $RBLT_0$ and $RBLC_0$ (true and complement, respectively) by way of pass gates 31; pass gates 31 for each of the 256 memory cells 40 are controlled by an associated local row line RL, so that the enabling of one of the 256 local row lines RL will cause pass gates 31 for one and only one memory cell 40 in redundant column $35_0$ to be connected to bit lines $RBLT_0$ and $RBLC_0$. Local row lines RL are common for redundant columns $35_0$, $35_1$ illustrated in FIG. 3, and for all redundant columns 35 in redundant column array block 30a.

Bit lines $RBLT_0$ and $RBLC_0$ in redundant column $35_0$ are each connected to the drain of a p-channel transistor 49; the sources of transistors 49 are connected to a precharge voltage, which in this case is $V_{cc}$, and the gates of transistors 49 are controlled by line $RCOLC_0$, issued by redundant column decoder $36_0$ associated with redundant column $35_0$, as will be described hereinbelow. Transistors 49 precharge bit lines $RBLT_0$ and $RBLC_0$ when line $RCOLC_0$ is at a low logic level, which occurs when redundant column $35_0$ is not selected. P-channel equilibration transistor 44 has its source-to-drain path connected between bit lines $RBLT_0$ and $RBLC_0$, and its gate connected to line $RCOLC_0$, so that during such time as line $RCOLC_0$ is low (i.e., during precharge via transistors 49), bit lines RBLT$_0$ and RBLC$_0$ are equilibrated to the same potential, which in this case is V$_{cc}$. Conversely, when redundant column 35$_0$ is to be selected, as indicated by line RCOLC$_0$ going low, precharge transistors 49 and equilibration transistor 44 are turned off, allowing the selected memory cell 40 to place a differential signal on bit lines RBLT$_0$, RBLC$_0$ via pass gates 31.

Bit lines RBLT$_0$ and RBLC$_0$ are connected to pass gates 46T, 46C, respectively, which control the coupling of bit lines RBLT$_0$ and RBLC$_0$ to redundant data bus 21, and thus to its associated redundant sense/write circuit 23$_1$. Pass gates 46T, 46C each include n-channel and p-channel transistors connected in parallel, with the gate of the n-channel transistor controlled by line RCOLT$_0$ and the gate of the p-channel transistor controlled by line RCOLC$_0$. When redundant column 35$_0$ is to be selected, its associated redundant column decoder 36$_0$ will drive line RCOLT$_0$ high and line RCOLC$_0$ low. Pass gates 46T, 46C thus connect bit lines RBLT$_0$, RBLC$_0$, to redundant data bus lines 21T, 21C, respectively, placing the selected memory cell 40 in communication with redundant sense/write circuit 23$_1$, in this case, for communication of data therebetween.

In this example, when the column address presented to memory 1 does not match the address of the column to be replaced by redundant column 35$_0$, its associated redundant column decoder 36$_0$ will cause line RCOLC$_0$ to be driven high and line RCOLT$_0$ to be driven low. Responsive to line RCOLC$_0$ being high, bit lines RBLT$_0$ and RBLC$_0$ will not be connected to redundant data bus 21, and precharge transistors 49 and equilibration transistor 44 will be turned on.

Figures 4, 5A:
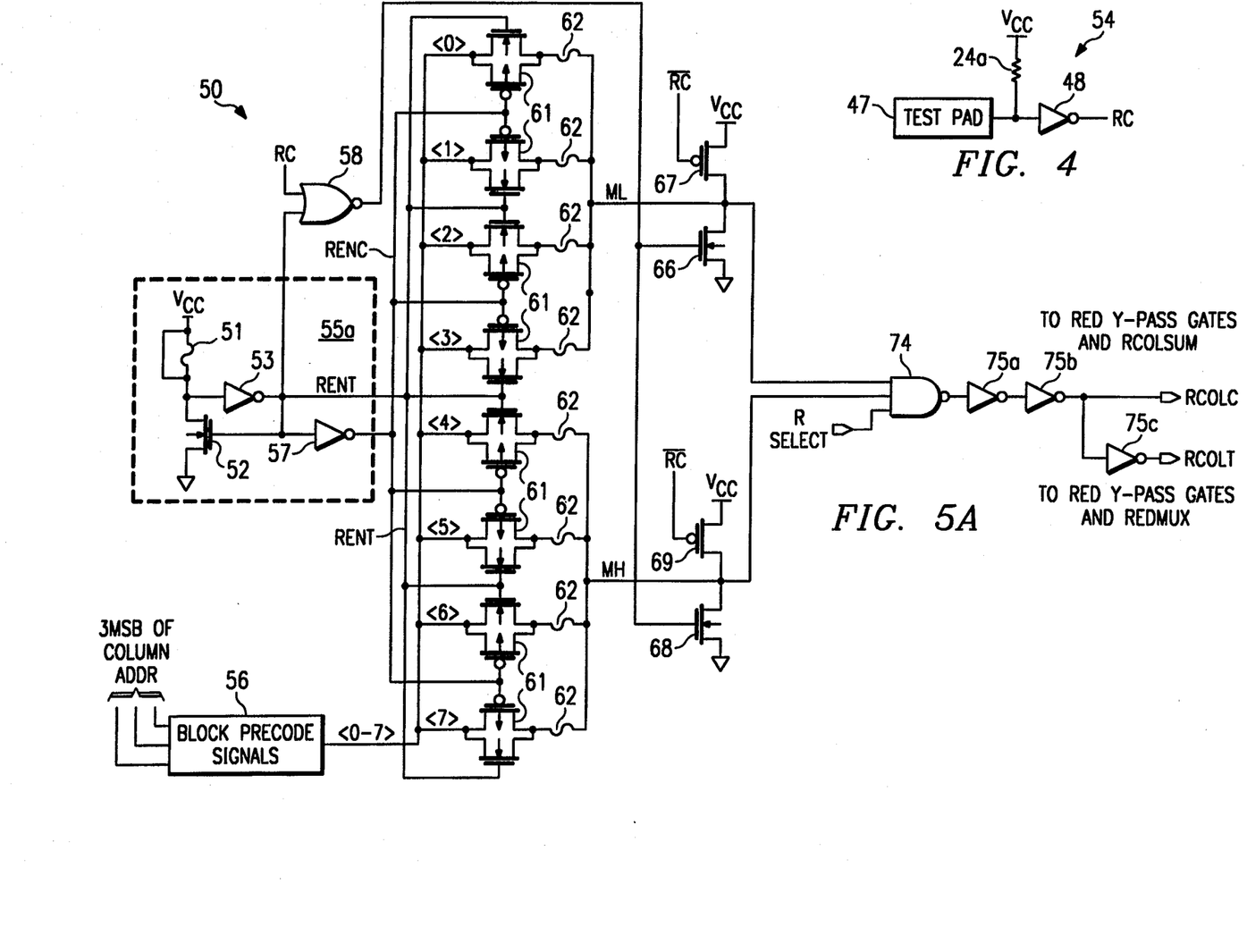
FIG. 4 is an electrical schematic of a column reducing check activation circuit in accordance with the invention.
FIGS. 5A and 5B are an electrical schematic of redundant column decoder accordance with the invention.

FIG. 4 is a circuit schematic of a redundancy element check enablement circuit 54. Check enablement circuit 54 is accessed by a tester using test probe pad 47. In a preferred embodiment, test probe pad 47 is not accessible after packaging of an integrated circuit, but only on the wafer during production. Test pad 47 is connected by a lead to the input of an inverter 48. The input of inverter 48 is also connected by a resistor 249 to a power rail held at V$_{cc}$ during testing and during actual use. A redundancy check (RC) signal high corresponds to evaluation of the redundant elements, requiring that the input to inverter 48 be taken low. Absent forcing test probe pad 47 low, RC status is low.

Figure 5B:
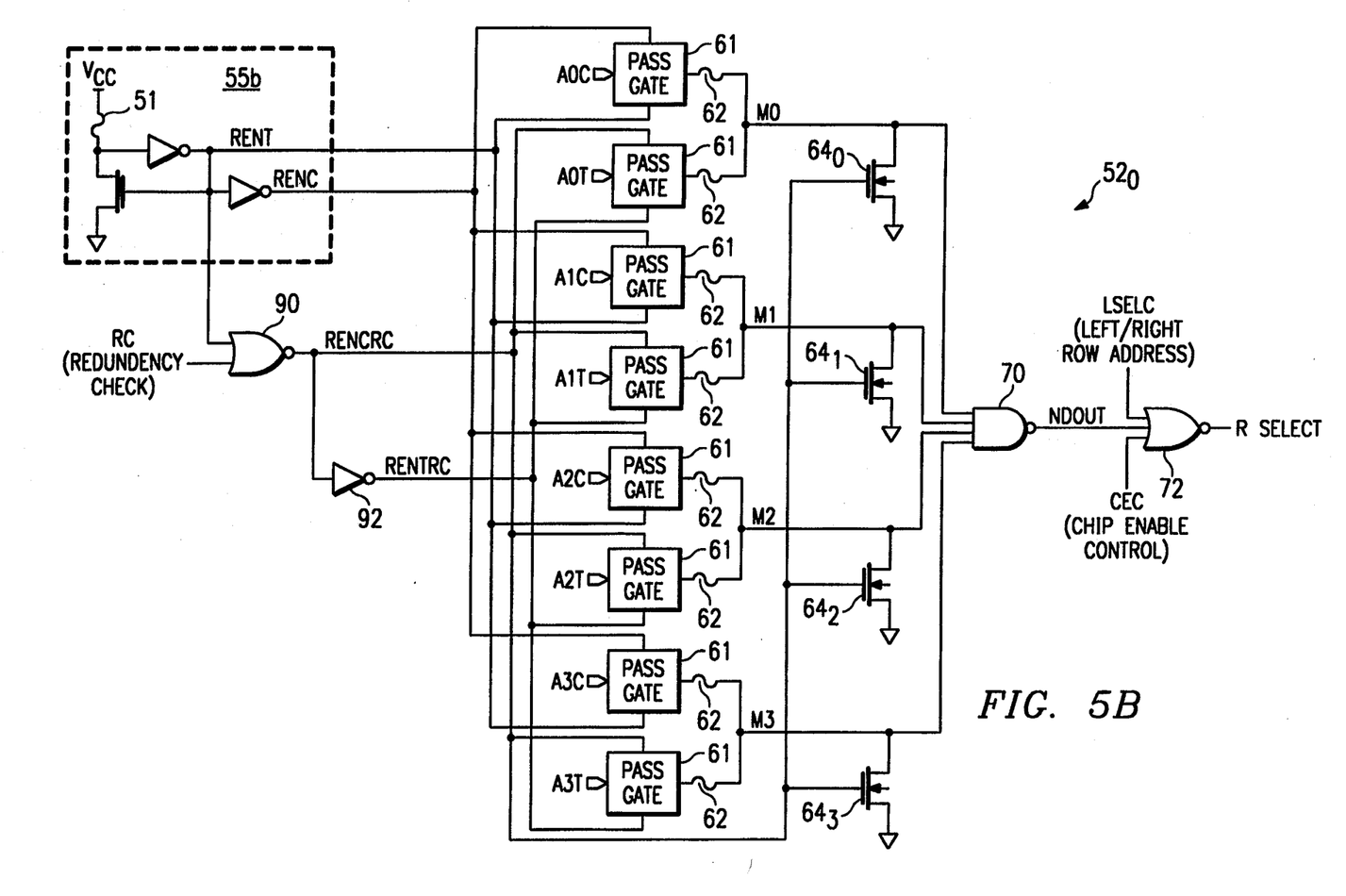

FIGS. 5a and 5b illustrate the construction of a block select circuit 50 and column select circuit 52 for one of redundant column decoders 36. Redundant column decoders 36$_1$ through 36$_{15}$ will of course be similarly constructed. As indicated above, each of redundant column decoders 36 include fuses by which redundancy is enabled for its associated redundant column 35, and by which the column address of the primary column to be replaced thereby is specified. The fuses are preferably conventional fuses, such as polysilicon fuses, and are preferably opened by a laser, electrical overstress, or other conventional techniques. Of course, other types of fuses, as well as antifuses and other permanently programmable selection techniques, may be used in the alternative to such fuses.

Each redundant column decoder 36$_0$ includes block select 50$_0$ and column select 52$_0$. Column select 52$_0$ receives, on lines CAT, CAC, true and complement (AXC and AXT) signals corresponding, in this example, to the four least significant column address bits of the address received by address buffers 28. The three most significant column address bits CA$_4$ through CA$_6$, after buffering, are decoded by column predecoder 56 (located in column decoders 26a, 26b, for example) in a similar manner as used to select one of the eight primary array blocks 10$_0$ through 10$_7$. While this particular example of redundant column decoder 36$_0$ decodes the column address using predecoded signals for the three most significant column address bits, it is of course contemplated that the use of predecoding, and the extent to which it is used, can be varied. For best efficiency, however, it is desirable that the redundant column decoding match that used in decoding the columns in primary array blocks 10.

The output from column predecoder 56 includes eight block select lines BZO through BZ7, communicated to block select 50$_0$ on bus BLK. Selection of one of eight blocks is made by appropriate combination of the block lines. As illustrated, one of block selects line BZ0 through BZ3 must be high and one of block select lines BZ4 through BZ7 must be high.

Sixteen blocks may be comprehended per array half so that one of sixteen blocks would be selected by one of lines BZ4 through BZ7 being high in combination with one of lines BZ0 through BZ3 being high. Other conventional predecoding schemes will, of course, be apparent to those of ordinary skill in the art.

Block select 50$_0$ includes an enable circuit 55a for enabling its operation if associated redundant column 35$_0$ is to replace a column in a primary array block 10. Otherwise operation of redundant column 35 is disabled, except during redundant element checking as described below. Enable circuit 55a includes fuse 51 connected between V$_{cc}$ and the drain of n-channel transistor 52; the source of transistor 52 is connected to ground. The drain of transistor 52 is connected to the input of inverter 53, which drives line RENT at its output. The output of inverter 53 is also connected to the gate of transistor 52, and to the input of inverter 57 which drives line RENC at its output. Accordingly, with fuse 51 intact (as is the case when redundancy is not enabled), V$_{cc}$ is presented to the input of inverter 53 which presents a low logic level at its output on line RENT, maintaining transistor 52 off; line RENC is driven high by inverter 57. When fuse 51 is opened (as is the case when redundancy is enabled), transistor 52 eventually turns on as the input to inverter 53 leaks to ground by way of junction leakage through transistor 52. A high logic level then appears at line RENT, maintaining transistor 52 on and the input of inverter 53 at ground, and also driving a low logic level at the output of inverter 57 on line RENC.

Lines RENT, RENC from enable circuit 55b are connected to a plurality of pass gates 61 in block select 50$_0$, each of pass gates 61 including n-channel and p-channel transistors in parallel. The gate of each of the n-channel transistors receives line RENT and the gate of each of the p-channel transistors receives line RENC. Each of pass gates 61 receives one of the block lines of line BLK from column predecode 56 on one side, and is connected to a fuse 62 on its other side. The four fuses 62 associated with block select lines BZ0 through BZ3 are connected together and to a first input of NAND gate 74. Pull-down n-channel transistor 66 has its source/drain path connected between node ML and ground. The two fuses 62 associated with block select lines BZ4–BZ7 are connected together and to a second input of NAND gate 74. N-channel transistor 68 is similarly connected between node MH and ground. The third input to NAND gate 74 is the RSELECT signal from column select circuit The gates of transistors 66 and 68 are driven by the output of NOR-gate 58. The inputs to NOR-gate 58 are signal RC and RENT, respectively. When the status of RC is low the output of NOR-gate 58 tracks RENC. When RC is high the output of NOR-gate 58 is low and transistors 66 and 68 are driven into cut-off. Simultaneously $RC_c$ (the complement of RC) is low driving transistors 67 and 69 into conduction and forcing the first and second inputs of NAND gate 74 high. A low status of RSELECT indicates no selection of a column which in turn drives the output of NAND gate 74 high. RSELECT high (indicating a selection) drives the output of NAND gate 74 low. If RC is low and enable circuit 55 is off (i.e. fuse 51 is intact), RENC (Redundant enable complement) and the output of NOR-gate 58 are high and transistors 66 and 68 are driven on pulling the nodes ML and MH low. If enable circuit 55a is on RC will be off and NOR-gate 58 operates as an inverter of the RENT signal. In other words the output of NOR-gate 58 tracks RENC. Transistors 67 and 69 will be off so the levels on ML and MH will depend on the signals B0-B7.

The output of NAND gate 74 presents signals on lines $RCOLC_0$, $RCOLT_0$, via two inverters (75a and 75b) and three inverters (75a, 75b and 75c), respectively, which are communicated to redundant column $35_0$ as described hereinabove. In this embodiment of the invention, therefore, redundant column $35_0$ is selected only when the output of NAND gate 74 is low, which occurs only when all three inputs thereto (nodes MH, ML, and RSELECT) are high.

The third input of NAND gate 74, on line RSELECT, is generated by NOR gate 72 in column select $52_0$. NOR gate 72 receives an input on line NDOUT from NAND gate 70, and also receives an input on line LSELC from row decoder 24a (indicating with a low logic level that a row in the array half associated with redundant column decoder $36_0$ is being selected), and an input on line CEC (indicating with a low logic level that memory 1 is enabled).

Column select $52_0$ includes an enabling circuit 55b, which is similar to enabling circuit 55a, generating signals on its lines RENT, RENC as described above. Normally, enable circuit 55b is activated by cutting fuse 51. NOR gate 90 and inverter 92 provide a bypass circuit enabled by RC going high. When RC is low the output of NOR gate 90 (RENC RC) tracks RENC and the output of inverter 92 (RENT RC) tracks RENT. When RC is high and enablement circuit 55b is not activated, RENC RC is low and RENT RC goes high. RENTRC is applied to n-channel transistors of selected pass gates 61, as is RENT. RENCRC is connected to the p-channel transistors of selected pass gates 61, as is RENC.

Pass gates 61 are programmed to a unique address for access to the sixteen redundant columns when using redundancy check by selection of pass gates to receive RENTRC and RENCRC. Each redundant column thereby has a unique address for purposes of testing the column. This test address has nothing to do with an address for which the redundant column may be substituted. The column select circuit 52 is programmed to select on the address 1111 by hardwiring the outputs of NOR gate 90 and inverter 92 to pass gates 61 for address lines A0T, A1T, A2T and A3T. Obviously, alternative combinations of four pass gates 61 may be connected to receive RENTRC and RENCRC, where one of each true/complement pair (e.g. A1T, A1C) is connected to receive the signals. Column select $52_0$ receives eight lines from bus COL (see FIGS. 1 and 2) on which is communicated true and complement signals for each of the four least significant column address bits $CA_0$ through $CA_4$. Each of the lines from bus COL is connected to one side of a pass gate 61, and in turn to a fuse 62; pass gates 61 are connected to and controlled by lines RENT, RENC in similar manner as in block select $50_0$ described above.

In column select $52_0$, the pair of fuses 62 associated with the true and complement lines CAT, CAC for the same address bit are connected together and communicated to an input of NAND gate 70. For example, true and complement column address lines $CAT_3$, $CAC_3$, respectively, are connected via pass gates 61 and fuses 62 to a common node M3, and to an input of NAND gate 70. N-channel pull-down transistor $64_3$ as well as n-channel pull-down transistors $64_0$, $64_1$, and $64_2$ have their source/drain path connected between nodes M3, M2, M1 and M0 and ground, and their gates connected to the output of NOR-gate 90 (RENCRC), which, when RC is low, tracks RENC. If RENCRC is low, transistors 64 are off and pass gates 61 are conductive passing high or low values to nodes M0, M1, M2 and M3. If RENCRC goes high, transistors 64 are driven into conduction turning pass gates 61 off. Nodes M0 through M3 also provide inputs to NAND gate 70, and are each connected to the pair of fuses 62 associated with their true and complement column address signals, respectively. As will be evident below, the selection of redundant column $35_0$ requires that all four of nodes M0 through M3 are high, so that the output of NAND gate 70 is low, enabling the output of NOR gate 72 (RSELECT) to be high, in turn enabling the output of NAND gate 74 to be low.

A redundant column decoder $36_0$ may be used to as a substitute for a regular column upon a positive test result of the column. The use of one of redundant columns 35 does not necessitate the use of all redundant columns 35, as column decoders 36 are individually enabled by enabling circuits 55a, 55b therewithin. In the event that redundant column 35 is not to replace a primary column, fuses 51 in enabling circuits 55a, 55b are both left intact. As discussed above, this forces lines RENT to be low at the output of each of enabling circuits 55a, 55b, maintaining all pass gates 61 off. Transistors $64_0$ through $64_3$, 66, and 68 are all maintained on, forcing the output of NAND gates 70, 74 both high. The high level at the output of NAND gate 74 is communicated to redundant column $35_0$ as a high level on line $RCOLC_0$ and a low level on line $RCOLT_0$, turning off pass gates 46T, 46C therein (see FIG. 3), and isolating redundant column $35_0$ from being accessed.

If redundant column $35_0$ is to replace a primary column in one of primary array blocks 10, selected fuses in redundant column decoder 36 are opened, for example by way of a laser beam. Regardless of the address to be replaced, fuses 51 in both enabling circuits 55a, 55b are opened, forcing line RENT high and line RENC low in each, turning on all pass gates 61 and turning off all of transistors $64_0$ through $64_3$, 66, and 68. Column select $52_0$ and block select $52_0$ are thus enabled to compare the incoming column address value against that specified by the blowing of fuses 62.

The address of the column to be replaced is programmed into column select $52_0$ by blowing those fuses 62 which do not correspond to the four least significant bits of the address of the column to be replaced. For example, if the four least significant bits of the address of the column to be replaced are 0110 (addresses $CA_3$, $CA_2$, $CA_1$, $CA_0$, respectively), fuses 62 associated with lines $CAT_3$, $CAC_2$, $CAC_1$, and $CAT_0$ are opened. All of nodes M0 through M3 will thus be high, and the output of NAND gate 70 low, only if the four least significant bits of the column address are 0110; as noted hereinabove, the output of NAND gate 70 must be low in order for redundant column $35_0$ to be selected. Any other four bit value will cause at least one of nodes M0 through M3 to be low, causing the output of NAND gate 70 to be forced high, preventing the selection of redundant column $35_0$. Thus it may be seen that programming of the select circuit for testing has no effect on programming of the select circuit for substituion.

Block decode $50_o$ is similarly programmed, by opening fuse 51 in enabling circuit 55b and by opening those fuses which do not correspond to the desired block select code of the column to be replaced by redundant column $35_0$. As a result, nodes MH and ML will both be high, allowing the selection of redundant column $35_0$, only if the column address corresponds to primary array block $10_3$, in which case lines BZ3 and BZ4 are both at a high level.

In the event that a column address received by memory 1 corresponds to the block and column address programmed by fuses 62 in redundant column decoder $36_0$, and that the row address received by memory 1 is one of those associated with the half-array served by redundant column $35_0$, all inputs to NAND gate 74 are at high logic levels. NAND gate 74 thus presents a high logical level on line $RCOlT_0$ and a low logic level on line $RCOLC_0$, turning on pass gates 46T, 46C for redundant column $35_0$, and enabling access to the memory cell 40 therein corresponding to the received row address.

The programming of fuses 51, 62 in redundant column decoder $36_o$ thus determines the column to be replaced by its associated redundant column $35_0$. Since each of redundant column decoders 36 is similarly constructed, in this example of memory 1, up to eight redundant columns 35 in each half-array of memory 1 may be programmed to replace a column, regardless of the primary array block 10 in which the column to be replaced is located.

As noted, two sense/write circuits 23 are available to redundant columns 35 in any access (four redundant columns 35 in each half-array assigned to each of sense/write circuits 23). This allows two redundant column decoders 36 in the same half-array to be programmed with the same column address, allowing access of two of redundant columns 35 in the same access, as the present invention allows selection of which input/output terminal DQ that each of redundant sense/write circuits 23 is to be assigned, for each programmed redundant column decoder. This is accomplished by way of redundant multiplexors 39, an example of one of which is shown in FIG. 6.

Figures 6, 7:
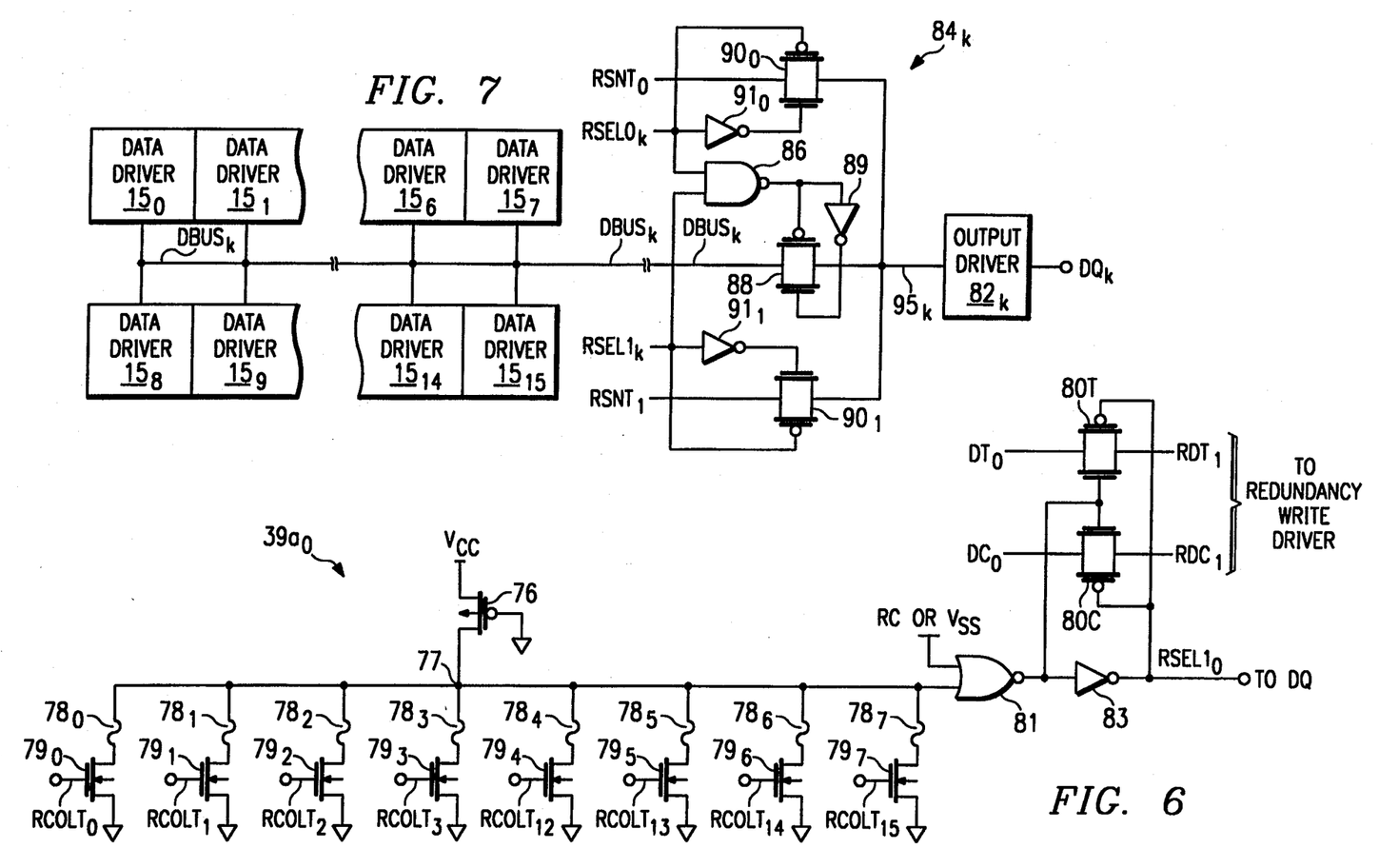
FIG. 6 is an electrical schematic of an input/output multiplexor for columns in accordance with the invention.
FIG. 7 is a mixed block diagram and electrical schematic of a final data multiplexor.

Redundant multiplexor $39a_0$ in FIG. 6 is one of the redundant multiplexors 39a in redundant multiplexor block 38a of FIGS. 1 and 2. Accordingly, redundant multiplexor $39a_0$, is associated with redundant sense/write circuit $23_1$ (and not with redundant sense/write circuit $23_0$), and with those redundant columns 35 which are sensed, or written to, by redundant sense/write circuit $23_1$. Accordingly, redundant multiplexor $39a_0$ of FIG. 6 receives, as inputs, redundant column select lines $RCOLT_0$ through $RCOLT_3$ from redundant column decoders $36_0$ through $36_3$ in redundant column select block 34a, and also redundant column select lines $RCOLT_{12}$ through $RCOLT_{15}$ from redundant column decoders $36_{12}$ through $36_{15}$ in redundant column select block 34b. This is true during redundancy check mode as well as after substitution a redundant column for a regular column.

Each of the redundant column select lines RCOLT are received at the gate of an associated n-channel transistor 79, which has its drain connected to an associated fuse 78, and which has its source connected to ground. As discussed hereinabove, the redundant column select line RCOLT is driven to a high logic level by its associated redundant column decoder 36 when its associated redundant column 35 is selected by the column address (and one bit of the row address, in this example). Each of fuses 78 are connected between the drain of its associated transistor 79 and node 77. P-channel pull-up transistor 76 has its source/drain path connected between node 77 and the $V_{cc}$ power supply, and has its gate biased to ground; transistor 76 is preferably a relatively small transistor so that excessive DC current is not drawn therethrough when node 77 is pulled low by one of transistors 79, while still being capable of pulling node 77 high if it is not pulled low by any of transistors 79. The state of node 77 is communicated, via NOR-gate 81, 83, as a signal on line $RSEL1_0$, when RC appears as on input to NOR-gate 81.

Line $RSEL1_0$ enables selection, when at a low logic level, of the redundant data from redundant sense/write circuit $23_1$ to be applied to input/output terminal $DQ_0$. In addition, line $RSEL1_0$ is connected to the gates of p-channel transistors in pass gates 80T, 80C, while its complement from the output of inverter 81 is connected to the gates of the n-channel transistors in pass gates 80T, 80C. Accordingly, a low logic level at node 77 will also cause coupling of input data lines $DT_0$, $DC_0$ from input/output terminal $DQ_0$ to redundant input data lines $RDT_1$, $RDC_1$ connected to the write circuitry 54 of redundant sense/write circuit $23_1$.

In operation, if redundancy is enabled by the opening of fuses in redundance column decoders 36, the selection of the input/output terminal DQ that each selected redundant column 35 is to be associated with is made by opening selected fuses 78 in the redundant multiplexors 39. In this example, when redundancy is enabled in the event of detection of a primary array column to be replaced, the test program must determine the association between each redundant column 35 to be used and the input/output terminal DQ to which it is to be associated for the replaced address. For each redundant column 35 that is to be accessed, its fuses 78 are opened in each redundant multiplexer 39 associated with input/output terminals with which the redundant column 35 is not to communicate; in the redundant multiplexer 39 associated with its input/output terminal, the fuse 78 for the redundant column 35 is left intact. Upon completion of the programming of redundant multiplexors 39, for each redundant column 35 that is to be accessed, one and only one of its fuses 78 is left intact, namely the fuse 78 in the redundant multiplexer 39 associated with the operative input/output terminal DQ. It should be noted that a redundant multiplexer 39 may have more than one of its fuses 78 left intact, as multiple ones of redundant columns 35 (corresponding to different column address values, of course) may be associated with the same input/output terminal DQ. For example, if the redundant columns 35 to be in communication with input/output terminal $DQ_0$ when selected are $35_2$ and $35_{12}$, fuses $78_0$, $78_1$, $78_3$, $78_5$, $78_6$, $78_7$ in redundant multiplexor $39a_0$ are all opened, and fuses $78_2$ and $78_4$ are left intact. Corresponding fuses $78_2$ and $78_4$ in the other redundant multiplexors $39a$ are opened, as redundant columns $35_2$ and $35_{12}$ will never be in communication with any of the input/output terminals DQ other than terminal $DQ_0$.

Prior to the completion of the decoding of the column address by redundant column decoders 36, all lines RCOLT are at low logic levels. This causes node 77 to remain at a high level via transistor 76, such that line $RSEL1_0$ at the output of redundant multiplexor $39a_0$ is pulled to a high level via NOR-gate 81 and inverter 83. If the column address decoded by redundant column decoders 36 does not correspond to any of the redundant columns 35 for which the corresponding fuses 78 remain intact, node 77 will not be pulled low via a combination of a transistor 79 and an intact fuse 78. If, however, the column address decoded by redundant column decoders 36 matches that of a redundant column 35 for which its corresponding fuse 78 is intact, the turning on of the associated transistor 79 will pull node 77 low through the intact fuse 78. A low logic level will then be driven on line $RSEL1_0$, connecting redundant sense-/write circuit $23_1$ to input/output terminal $DQ_0$, for both read and write operations.

The use of redundant multiplexors 39 provides a great degree of flexibility in the utilization of redundant columns 35. Any one of the redundant columns 35 may be mapped to any one of the available input/output terminals DQ by way of a relatively simple algorithm according to the present invention. Redundant multiplexors 39 provide such mapping with relatively few transistors, minimal loading on the data lines, and little, if any, performance degradation in accessing a redundant location relative to a primary memory cell. Conventional mapping circuits have required significantly more transistors than according to the present invention, thus presenting relatively high load to the data lines, often resulting in an access time differential between redundant and primary memory cells.

During testing of redundant columns 35 all of fuses 78 remain intact and thus no selection of an input/output terminal $DQ_x$ for the column undergoing testing has been made. As a result, the redundant column $35_x$ undergoing testing is connected to all eight available input/output terminals $DQ_x$. Such increased loading on redundant column $35_x$ will alter the timing of integrated circuit memory 1 which may be undesirable.

Redundant multiplexor $39a_0$, however, provides for driving only one input/output terminal $DQ_0$. To all redundant multiplexors $39a_x$ but one, the top input to NOR-gate 81 is tied to RC during testing. In redundant multiplexor $39a_0$, the top input of NOR-gate 81 is tied to $V_{ss}$. Producing a low logic level on $RSEL1_0$ requires both inputs to NOR-gate 81 be low. This can occur for only one redundant multiplexor 39, the one where NOR-gate 81 is connected to receive $V_{ss}$ as one input. It should be noted that regular columns need not be disconnected for redundancy checking to be performed. RC is high during redundancy checking.

Referring now to FIG. 7, an output multiplexor $84_k$ located within input/output circuitry 20 and its operation are described. Output multiplexor $84_k$ is controlled by the output of the redundant multiplexors $39a_k$, $39b_k$ by lines $RSEL0_k$, $RSEL1_k$ generated as described above. As shown in FIG. 7, output multiplexor $84_k$ is connected to an associated one of data bus conductors $DBUS_k$ in data bus 22, as are the appropriate ones of data drivers 15 associated with the primary array blocks 10. In this embodiment of the invention, the primary column to be replaced by one of the redundant columns 35 is not physically disabled; instead, output multiplexors 84 merely select whether data bus conductor $DBUS_k$ or the output of a redundant sense/write circuit 23 is to be placed in communication with the associated input/output terminal $DQ_k$.

Included within output multiplexor $84_k$ is pass gate 88 formed of n-channel and p-channel transistors with their source/drain paths connected in parallel between data bus conductor $DBUS_k$ and node $95_k$. Node $95_k$ is connected to output driver $82_k$, which drives input/output terminal $DQ_k$ in the conventional manner. Any conventional output driver circuit may be used as output driver $82_k$.

Also connected to node $95_k$ are pass gates $90_0$, $90_1$, each formed of n-channel and p-channel transistors with their source/drain paths connected in parallel between node $95_k$ and lines $RSNT_0$, $RSNT_1$, respectively. As described hereinabove, lines RSNT are the true data state lines presented by redundant sense/write circuits 23 responsive to the data state sensed thereby.

Signals on lines $RSEL0_k$ and $RSEL1_k$ control which of pass gates 88, $90_0$, or $90_1$ is conductive for a read operation. Line $RSEL0_k$ is connected to the gate of the p-channel transistor in pass gate $90_0$, to an input of NAND gate 86 and, via inverter $91_0$, to the gate of the n-channel transistor in pass gate $90_0$. Similarly, line $RSEL1_k$ is connected to the gate of the p-channel transistor in pass gate $90_1$, to an input of NAND gate 86 and, via inverter $91_1$, to the gate of the n-channel transistor in pass gate $90_1$. The output of NAND gate is coupled to the gate of the p-channel transistor in pass gate 88, and is coupled to the gate of the n-channel transistor in pass gate 88 via inverter 89.

In operation, if redundancy is not enabled, or if redundancy is enabled but the column address does not match that for which a redundant column 35 associated with input/output terminal $DQ_k$ is selected, both of lines $RSEL0_k$ and $RSEL1_k$ will be at a high logic levels. Both of pass gates $90_0$, $90_1$ will be off, and pass gate 88 will be on, such that data bus conductor $DBUS_k$ is connected to node $95_k$ to the exclusion of redundant data lines RSNT. In a read operation, output driver $82_k$ will thus drive its input/output terminal $DQ_k$ to the data state corresponding to that of data bus conductor $DBUS_k$, as driven by the selected one of primary array data drivers 15.

In the event that redundancy is enabled, however, and the column address received by memory 1 corresponds to one of the redundant columns 35 which is to be associated with input/output terminal $DQ_k$, as described hereinabove the appropriate redundant multiplexor $39a_k$, $39b_k$ will drive its corresponding line $RSEL0_k$ or $RSEL1_k$ to a low logic level. This will cause the output of NAND gate 86 to go to a high logic level, turning off pass gate 88 and isolating node $95_k$ from data bus conductor $DBUS_k$ so that the data state driven thereupon by the data driver 15 associated with the primary column to be replaced is ignored. The one of pass gates 90 associated with the one of lines $RSEL_k$ that is driven low will be turned on, so that the data line RSNT from the associated redundant sense/write circuit 23 will be connected to node 95$_k$. Output driver 82$_k$ will thus present a logic level corresponding to the selected memory cell 40 in the redundant column 35 that has replaced the failed primary column.

As noted above, coupling of the redundant input data lines RD for the selected redundant sense/write circuit 23 is accomplished within redundant multiplexors 39. Since the writing of a data state to the memory cells in the replaced column is irrelevant, as the replaced column is ignored by the operation of output multiplexors 84, no disconnection from the primary input data bus is required. The chip area required for implementation of memory 1 according to this embodiment of the invention is thus relatively efficient, as column disconnect fuses are not necessary.

One of output multiplexors 84 is associated with each of input/output terminals DQ in memory 1; in this example, therefore, eight such output multiplexors are provided. Of course, if differential data buses are provided, each of output multiplexors 84 would necessarily have to be duplicated so that multiplexing of the primary and redundant data is accomplished for the differential input to the output drivers 82.

Integrated circuit memory 1 includes redundant rows as well as redundant columns. In many products, redundant rows have many more memory cells than do redundant columns, making the potential improvement in integrated circuit yield even greater for every redundant row evaluated as against a redundant column. Generally, row address decoding circuitry is the same as column decoding circuitry. However, as described above, final multiplexing selects the appropriate column for an address from the regular column for the address and a redundant column programmed as a substitute for the regular column. This circuitry is also effective during evaluation of a redundant column, meaning that the parallel access to a regular column which occurs does not result in connection of the regular column to the input/output terminals. Such mutually exclusive output selection is not provided between regular rows and redundant rows.

Figure 8:
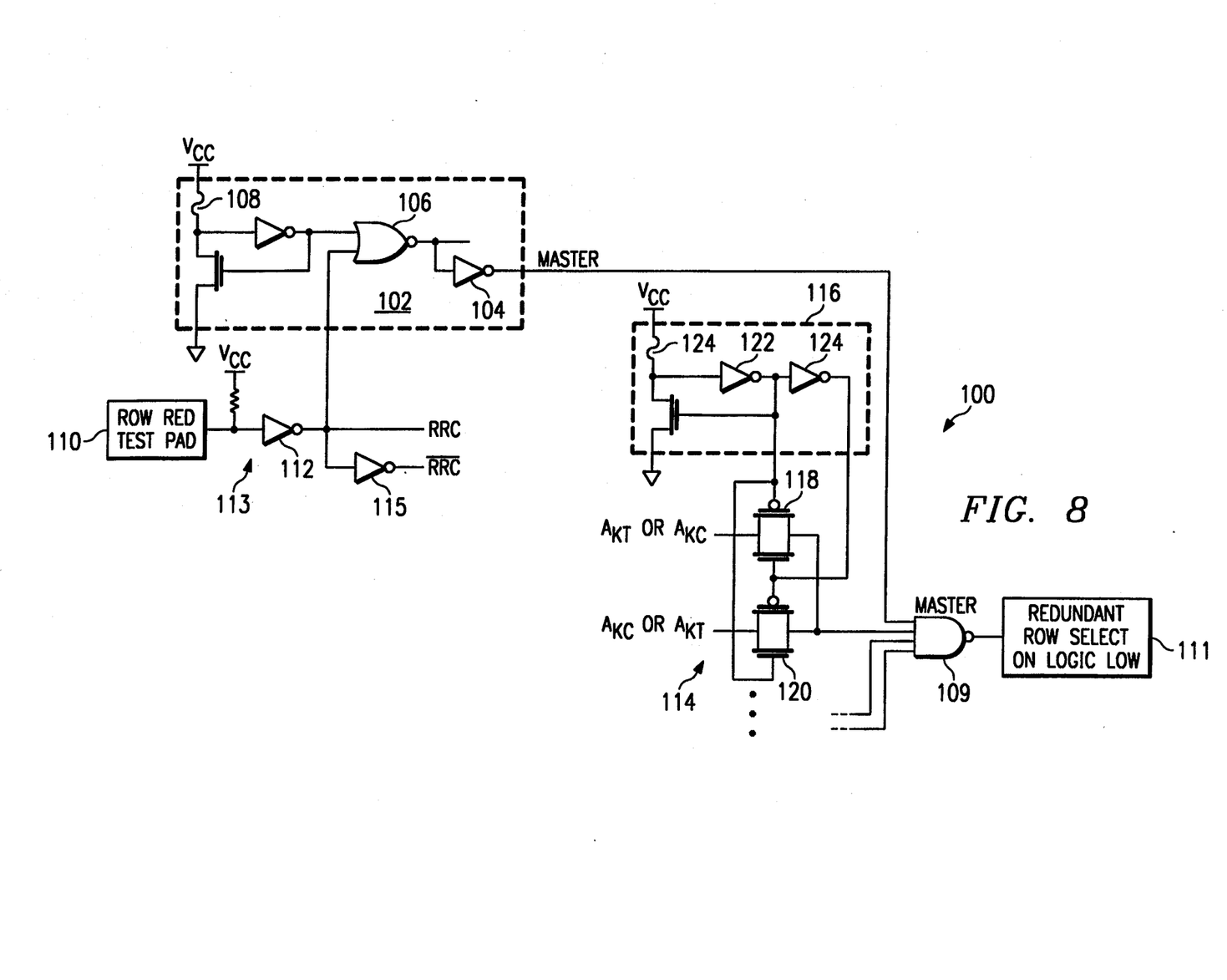
FIG. 8 is an electrical schematic of a redundant row decoder in accordance with the invention.

The provisional enablement of a redundant row using an address is described first, followed by discussion of the temporary disablement of the regular row associated with the address. As discussed above, circuitry identical to the column select circuitry of FIG. 5b may be used for redundant row decoding. FIG. 8 is a partial circuit schematic for an alternative address decoder 100. A master enablement driver 102 is provided which on power up makes use of all of the redundant rows. Enablement circuit 102 is substantially similar to enablement circuits 55 previously described. The output MASTER from inverter 104 is high if either (or both) inputs to NOR-gate 106 are high. The MASTER signal is applied to an input of NAND gate log, operating as an enablement signal when high. NAND gate 109 provides redundant row 111 selection on logic low on the output.

Driving an input to NOR-gate 106 high may be done by blowing fuse 108 or, for evaluation of the rows, by driving the Row Redundancy Test Pad 110 low to drive the row redundancy check (RRC) signal off of inverter 112 to logic high. Inverter 115 generates a row redundancy check complement signal, the use of which is described below.

A representative address bit decoder 114 includes a programming circuit 116 and a pair of oppositely connected pass gates 118 and 120. Programming circuit 116 resembles an enablement circuit as previously described, but is used here to control which of pass gates 118 or 120 is active. For pass gate 118 to be active, the output from inverter 122 must be logic low and the output of inverter 124 must be logic high. This occurs when fuse 124 is intact. To activate pass gate 120, the outputs of inverters 122 and 124 is reversed, meaning that fuse 124 is blown.

Pass gates 118 and 120 are connected to receive an address bit "a" and its complement "a" Similarly, the remaining address bit decoders 114 for redundant row decoder 100 are default programmed to pass either the true or the complement. The programming of the address bit decoders for other redundant row decoders are varied to provide redundant row response to a address unique among the redundant row. Thus, the selection of pass gates to apply the true and the complement lines associates each redundant row with an address for evaluation purposes. Again, as with redundant columns, this evaluation address in no way limits programmed association of the redundant row with another address. Again, no row selection is made with the MASTER enable signal being low, so coincidence of address applied with default address does not result in automatic selection of a redundant row 111.

For testing purposes the test engineer is supplied the unique default address for each redundant row decoder. The arrangement does somewhat complicate repair because the fuse blowing algorithm for each redundant row decoder 100 is unique. However, providing these algorithms is a one time problem only.

As stated above, the non-redundant or regular row associated with the default address for a redundant row must not be selected during evaluation of the redundant row. Further, the regular row must not be permanently disenabled. This can be done in several ways. For example, if the regular row has a precoder with an unused input, the RRC signal can be tied to the input to disenable the precoder. Of course, such a route may not be available.

Figure 9:
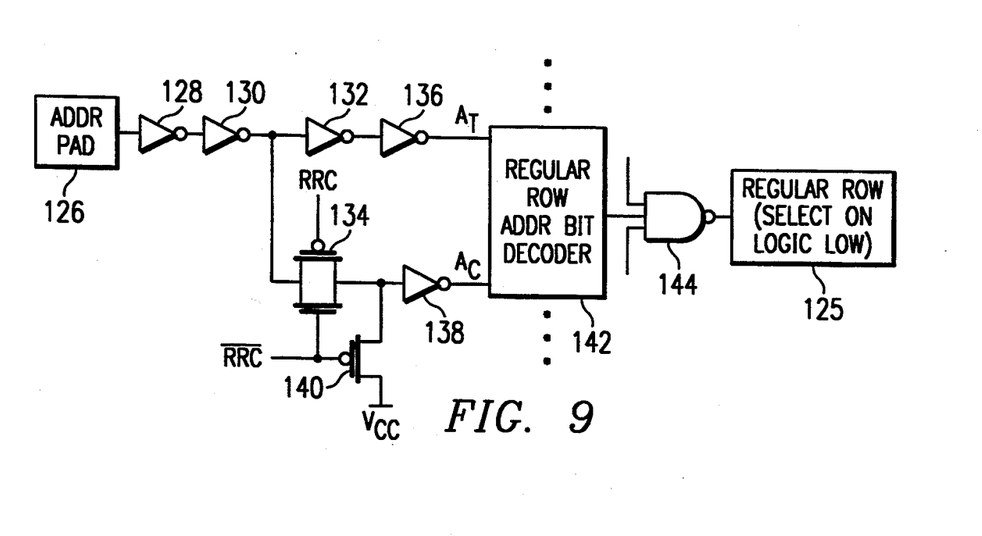
FIG. 9 is a mixed block diagram and circuit schematic of address decoder circuitry on one bit for a regular row.

FIG. 9 is a circuit schematic of a disenabling circuit for temporarily removing a regular row 125 from selection upon receipt of the address associated with the row. An address bit is applied to an address pad 126, and then buffered through two stages of inverters 128, 130. The output of inverter 130 is applied both to an inverter 132 and to a pass gate 134. The output of inverter 132 is applied to yet another inverter stage 136 to recover the address true bit. The output of pass gate 134 is applied to inverter 138 to provide an address complement bit. In normal operation pass gate 134 operates as a delay to maintain signal timing with inverter 132.

Pass gate 134 is active for RRC logic low and RRC$_c$ logic high. This also leaves transistor 140 in cutoff. When the states of RRC and its complement reverse, pass gate 134 is driven off and transistor 140 is driven on, forcing the output of inverter 138 low, notwithstanding changes in the logic level of A$_t$. Now, during evaluation, the address bit can be held low as well (i.e. A$_t$ and A$_c$ are both low), assuring that a low signal will be output by regular row, address bit decoder 142 to NAND gate 144, in turn assuring that its output is high to regular row 125. Thus row 125 is not selected.

Figure 10:
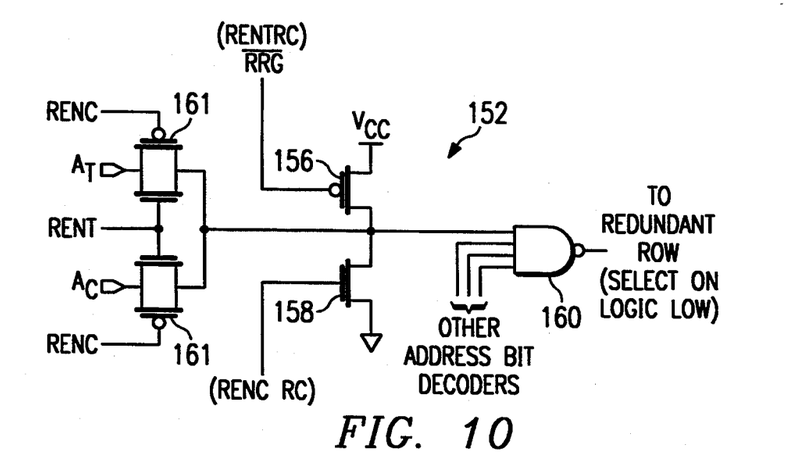

FIG. 10 is a circuit schematic for a redundant row decoder circuit portion 152. The circuit of FIG. 10 represent a modification of a redundant column selection circuit 52 along one address bit line, the address bit line corresponding to the address bit which is forced low in the both the true and complement for regular rows as illustrated in FIG. 9. Signals RENT and RENC correspond to similarly designated signals for redundant column selection circuit 52. The idea is to force a corresponding bit in an address low for regular rows and high for redundant rows. As described above in connection with FIG. 5b, during testing, RENC is high and RENT is low. Therefore pass gates 161 are nonconductive. $RRC_c$ is low and therefor p-channel transistor 156 is conductive to pull node L to logic high. The signal RENCRC is low, leaving n-channel transistor off and isolating node L from $V_{ss}$ and logic low. Node L is connected to an input of NAND gate 160 in effect enabling operation of NAND gate 160 notwithstanding changes in address bit value. The other inputs to NAND gate 160 are unchanged from those previously described.

While the invention has been particularly shown and described with reference to a preferred embodiment, it will be understood by those skilled in the art that various changes in form and detail may be made therein without departing from the spirit and scope of the invention.

What is claimed is:

1. An integrated circuit memory, comprising:
   a plurality of addressable elements organized as columns of memory cells;
   a plurality of redundant elements organized as redundant columns of memory cells;
   a programmable selection circuit for each redundant element for associating the redundant element with an address for access of the redundant element in place of an addressable element;
   bypass circuitry, responsive to a redundancy check signal and associated with each redundant element, for simulating access of the redundant element without modification of the progammable selection circuit for the redundant element;
   an enablement circuit for each redundant column; and
   means for applying the redundancy check signal to the bypass circuitry for bypassing the enablement circuit.

2. The integrated circuit memory of claim 1, further comprising:
   a plurality of output ports;
   a redundant multiplexor associated with each output port; and
   means responsive to the redundancy check signal for connecting a selected output port with all of the redundant columns.

3. An integrated circuit memory, comprising:
   a plurality of addressable elements organized as regular rows of memory cells;
   a plurality of redundant elements organized as redundant rows of memory cells;
   a programmable selection circuit for each redundant element for associating the redundant element with an address for access of the redundant element in place of an addressable element;
   bypass circuitry, responsive to a redundancy check signal and associated with each redundant element, for simulating access of the redundant element without modification of the progammable selection circuit for the redundant element;
   regular row address decoders for each regular row of memory cells;
   an address bit decoder in each regular row address decoder responsive to the redundancy check signal for forcing a selected output bit to a predetermined value regardless of address input, thereby suppressing selection of a regular row upon application of the address for the regular row.

4. The integrated circuit memory of claim 3, and further comprising:
   an enablement circuit for each redundant row; and
   means for applying the redundancy check signal to the bypass circuitry to bypass the enablement circuit.

5. The integrated circuit memory of claim 3, and further comprising:
   the bypass circuitry including forcing circuitry responsive to application of the redundancy check signal for forcing an output bit correlated with the selected output bit on a decoded address line to a select level.

6. An integrated circuit memory, comprising:
   a plurality of addressable elements;
   a plurality of redundant elements;
   a programmable selection circuit for each redundant element for associating the redundant element with an address for access of the redundant element in place of an addressable element; and
   bypass circuitry, responsive to a redundancy check signal and associated with each redundant element, for simulating access of the redundant element without modification of the progammable selection circuit for the redundant element, the bypass circuitry for each redundant element being actuated in response to an address unique among the redundant elements during application of the redundancy check signal;
   the redundant elements including redundant rows and redundant columns.

7. The integrated circuit of claim 6, wherein an address includes a row component and a column component to define a location.

8. An integrated circuit having regular elements and a redundant element for replacing a regular element, comprising:
   the redundant element being responsive to a select signal for actuation;
   a unique default address for each redundant element;
   means responsive to a decoded address for generating the select signal;
   a plurality of pass gates for decoding addresses connected to the means for generating;
   means for applying address signals to the plurality of pass gates;
   a plurality of programmable elements associated with a subset of the pass gates for configuration of the pass gates for decoding a subset of the address signals corresponding to an address of a regular element; and
   means responsive to application of a redundancy check signal to the integrated circuit for enabling a predetermined subset of pass gates to pass address signals corresponding to a default address.

9. The integrated circuit of claim 8, wherein the integrated circuit is a memory device and the regular elements are memory elements divided into blocks and further wherein an address portion associated with a regular element specifies a block and a position in the block.

10. The integrated circuit of claim 9, and further comprising:
a plurality of output ports;
a redundant multiplexor associated with each output port; and
means responsive to the :redundancy check signal for connecting a selected output port with the redundant element.

11. The integrated circuit of claim 10 wherein the redundant elements are a column of memory cells in a memory cell array.

12. The integrated circuit of claim 9, and further comprising:
a block decoder for the redundant element including a subset of the plurality of pass gates and associated configurable elements for decoding a block address for the redundant element; and
means responsive to application of the redundancy check signal for forcing indication of selection of the redundant element from the block decoder.

13. An integrated circuit having regular elements and redundant element for replacing a regular element, comprising:
the redundant element being responsive to a select signal for actuation;
means responsive to a decoded address for generating the select signal;
a plurality of pass gates for decoding addresses connected to the means for generating;
means for applying portions of an address signal to the plurality of pass gates;
a plurality of programmable elements associated with a subset of the pass gates for configuration of the pass gates for decoding a subset of the address signals corresponding to an address of a regular element; and
means responsive to application of a redundancy check signal to the integrated circuit for forcing generation of a select signal without configuration of the plurality of progammable elements.

14. The integrated circuit of claim 13, wherein the integrated circuit is a memory device and the regular elements are rows of a memory array and an address portion associated with a regular element specifies a regular row.

15. The integrated circuit of claim 14, and further comprising:

means responsive to application of the redundancy cheek signal for forcing nonindication of selection of a regular row in response to the application of the default address for the redundant element.

16. The integrated circuit of claim 15 wherein the redundant element is a row of memory cells in a memory cell array.

17. A method of testing redundant elements in an integrated circuit memory comprising regular elements associated with an address and organized into blocks and redundant elements accessed through decoding circuitry which is programmable by permanent modification of enablement and address pass gates to substitute for a regular element, the method comprising the steps of:
applying a redundancy check signal to a test pad;
passing the redundancy check signal to selected address pass gates to enable a subset of pass gates corresponding to a test address unique among the redundant elements;
responsive to application of a default address to the pass gates, generating a redundant element select signal;
passing the select signal to the redundant element; and
connecting the redundant element to an output terminal and block connection of the regular element associated with the default address from communication with the output terminal.

18. The method of claim 17 further comprising:
utilizing the redundancy check signal to force an output from a block address decoder.

19. A method of testing redundant elements in an integrated circuit memory comprising regular elements associated with an address and redundant elements accessed through decoding circuitry which is programmable by permanent modification of enablement and address pass gates to substitute for a regular element, the method comprising the steps of:
applying a redundancy check signal to a test pad;
using the redundancy check signal to force the output of a selected address pass gate to a select value;
responsive to application of a default address to the remaining address pass gates, generating a redundant element select signal; and
passing the redundant element select signal to the redundant element.

* * * * *